(12) United States Patent
Alam et al.

(10) Patent No.: US 12,431,905 B2
(45) Date of Patent: Sep. 30, 2025

(54) MRAM DEVICE WITH INTEGRATED CONTROLLER FOR FPGA SYSTEM AND METHODS THEREFOR

(71) Applicant: Everspin Technologies, Inc., Chandler, AZ (US)

(72) Inventors: Syed M. Alam, Austin, TX (US); Sanjeev Aggarwal, Scottsdale, AZ (US)

(73) Assignee: Everspin Technologies, Inc., Chandler, AZ (US)

( * ) Notice: Subject to any disclaimer, the term of this patent is extended or adjusted under 35 U.S.C. 154(b) by 199 days.

(21) Appl. No.: 18/329,793

(22) Filed: Jun. 6, 2023

(65) Prior Publication Data

US 2023/0403011 A1 Dec. 14, 2023

Related U.S. Application Data

(60) Provisional application No. 63/350,581, filed on Jun. 9, 2022.

(51) Int. Cl.
| | |
|---|---|
| *H03K 19/1776* | (2020.01) |
| *H01L 23/48* | (2006.01) |
| *H01L 23/498* | (2006.01) |
| *H10B 61/00* | (2023.01) |
| *H10N 50/10* | (2023.01) |

(52) U.S. Cl.
CPC ....... *H03K 19/1776* (2013.01); *H01L 23/481* (2013.01); *H01L 23/49816* (2013.01); *H10B 61/00* (2023.02); *H10N 50/10* (2023.02)

(58) Field of Classification Search
None
See application file for complete search history.

(56) References Cited

U.S. PATENT DOCUMENTS

| | | | |
|---|---|---|---|
| 9,336,849 B2 | 5/2016 | Alam et al. | |
| 9,336,872 B2 | 5/2016 | Andre | |
| 9,530,476 B2 | 12/2016 | Alam et al. | |
| 9,697,879 B2 | 7/2017 | Alam et al. | |
| 9,754,652 B2 | 9/2017 | Andre | |
| 9,973,194 B2 | 5/2018 | Tate et al. | |
| 10,411,711 B2 | 9/2019 | Kozaczuk et al. | |
| 2004/0177237 A1 | 9/2004 | Huppenthal et al. | |

(Continued)

FOREIGN PATENT DOCUMENTS

| | | |
|---|---|---|
| CN | 106059567 A | 10/2016 |
| CN | 110532222 A | 12/2019 |
| WO | 2016099580 A2 | 6/2016 |

OTHER PUBLICATIONS

Extended European Search Report issued on Oct. 5, 2023 in European Patent Application No. 23178149.3 (10 pages, in English).

*Primary Examiner* — Anh Q Tran
(74) *Attorney, Agent, or Firm* — Bookoff McAndrews, PLLC

(57) ABSTRACT

A memory device includes a printed circuit board, a magnetoresistive random-access memory (MRAM) device coupled to the printed circuit board, a controller or control circuitry, wherein the controller or control circuitry is integrated into, embedded in, or otherwise incorporated into the MRAM device, and a field programmable gate array (FPGA) coupled to the printed circuit board and in communication with the controller or control circuitry.

20 Claims, 3 Drawing Sheets

(56) References Cited

U.S. PATENT DOCUMENTS

| | | | |
|---|---|---|---|
| 2014/0082453 A1 | 3/2014 | Sikdar et al. | |
| 2016/0284422 A9 | 9/2016 | Ong | |
| 2019/0179532 A1 | 6/2019 | Tseng et al. | |
| 2020/0082885 A1* | 3/2020 | Lin | G11C 14/0081 |
| 2021/0373993 A1* | 12/2021 | Sharon | G11C 16/0483 |
| 2022/0157361 A1 | 5/2022 | Natsui et al. | |

* cited by examiner

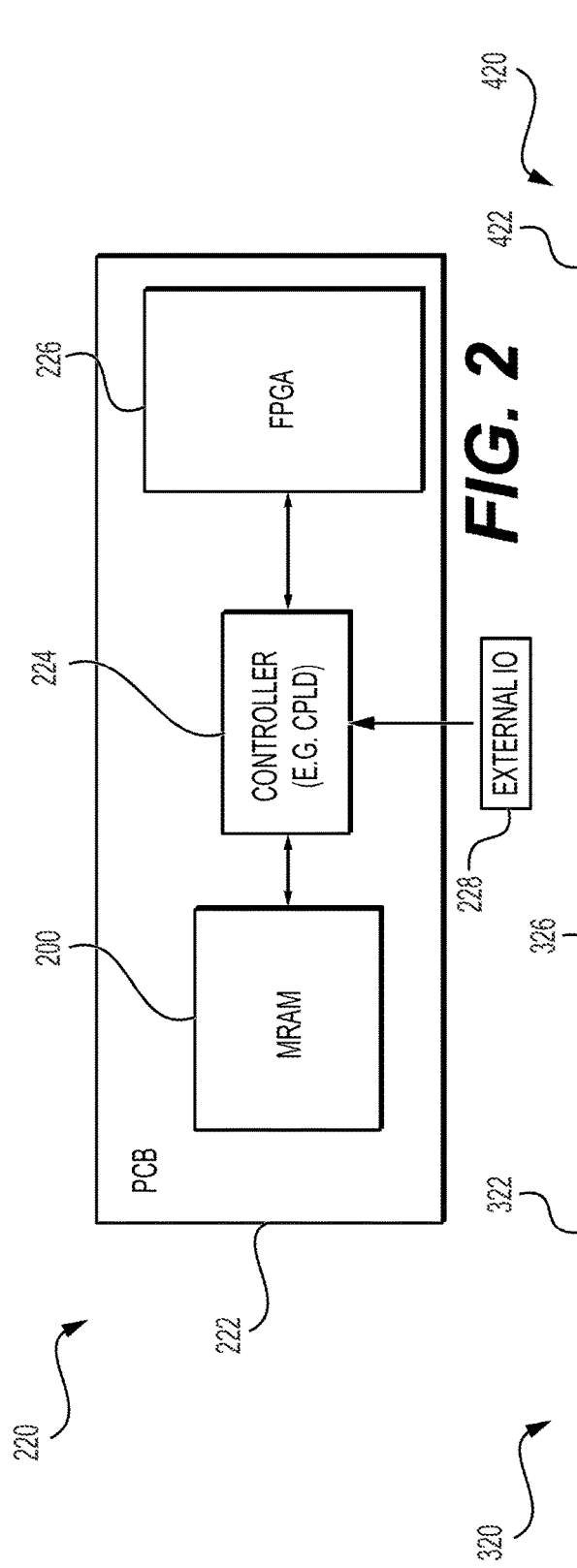
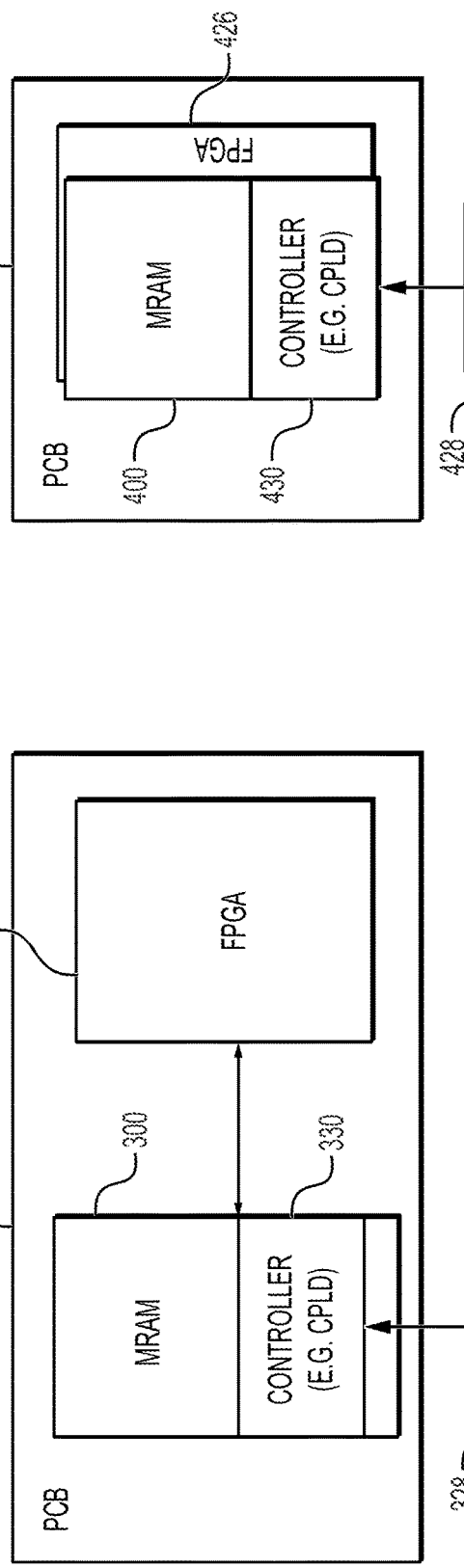

MRAM DEVICE WITH INTEGRATED CONTROLLER FOR FPGA SYSTEM AND METHODS THEREFOR

CROSS-REFERENCE TO RELATED APPLICATION

This application claims benefit to U.S. Provisional Patent Application No. 63/350,581, filed Jun. 9, 2022, the entire contents of which are incorporated herein by reference.

TECHNICAL FIELD

Embodiments of the present disclosure relate to, among other things, systems and methods for magnetoresistive random-access memory (MRAM) devices, including systems and methods for MRAM devices that include an integrated controller for a Field Programmable Gate Array (FPGA).

INTRODUCTION

In general, a memory system may include a memory device for storing data and a host (or controller) for controlling operations of the memory device. Memory devices may be classified into volatile memory (such as, e.g., dynamic random-access memory (DRAM), static random-access memory (SRAM), etc.) and non-volatile memory (such as, e.g., electrically erasable programmable read-only memory (EEPROM), ferroelectric random-access memory (FRAM), phase-change memory (PRAM), magnetoresistive random-access memory (MRAM), resistive random-access memory (RRAM/ReRAM), flash memory, etc.). Additionally, memory devices may be packaged on one or more circuits, for example, printed circuit boards (PCBs). However, memory devices with controller circuitry and/or other programmable devices may require a larger size PCB, a larger number of connections (e.g., input/output connections), and/or otherwise require complicated circuitry.

BRIEF DESCRIPTION OF THE DRAWINGS

In the course of the detailed description that follows, reference will be made to the appended drawings. The drawings show different aspects of the present disclosure and, where appropriate, reference numerals illustrating like structures, components, materials, and/or elements in different figures are labeled similarly. It is understood that various combinations of the structures, components, and/or elements, other than those specifically shown, are contemplated and are within the scope of the present disclosure.

Moreover, there are many embodiments of the present disclosure described and illustrated herein. The present disclosure is neither limited to any single aspect nor embodiment thereof, nor to any combinations and/or permutations of such aspects and/or embodiments. Moreover, each of the aspects of the present disclosure, and/or embodiments thereof, may be employed alone or in combination with one or more of the other aspects of the present disclosure and/or embodiments thereof. For the sake of brevity, certain permutations and combinations are not discussed and/or illustrated separately herein; however, all permutations and combinations are considered to fall within the scope of the present inventions.

FIG. 2 depicts a functional block diagram of a circuit with an exemplary expanded serial peripheral interface (xSPI) MRAM device, according to aspects of this disclosure.

FIG. 3 depicts a functional block diagram of a circuit with another exemplary expanded serial peripheral interface (xSPI) MRAM device, according to aspects of this disclosure.

FIG. 4 depicts a functional block diagram of a circuit with yet another exemplary expanded serial peripheral interface (xSPI) MRAM device, according to aspects of this disclosure.

Figure 1:
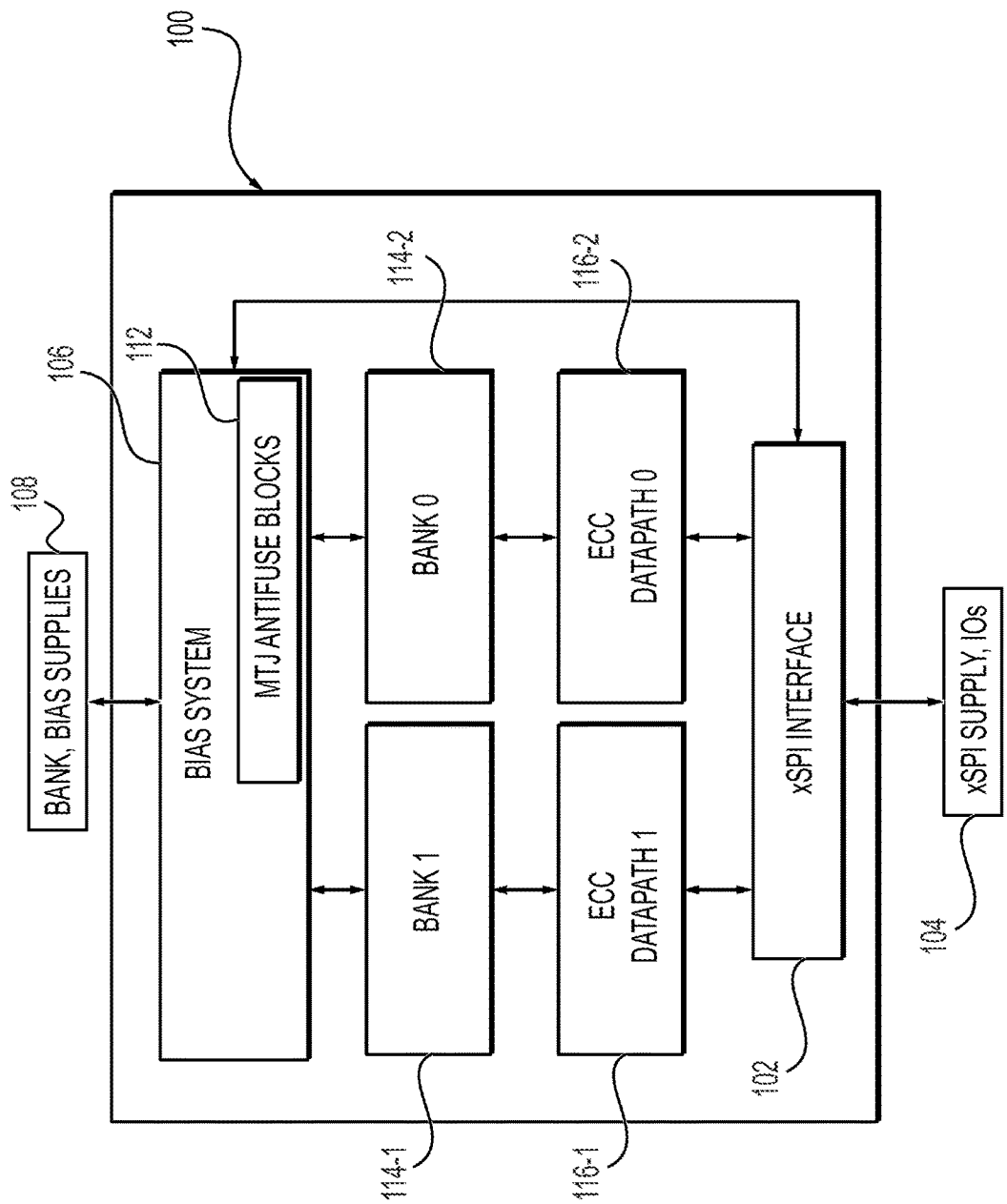
FIG. 1 depicts a functional block diagram of an exemplary MRAM device, according to aspects of this disclosure.

As used herein, the terms "comprises," "comprising," "has," "having," "includes," "including," or any other variation thereof, are intended to cover a non-exclusive inclusion, such that a process, method, article, or apparatus that comprises a list of elements does not include only those elements, but may include other elements not expressly listed or inherent to such process, method, article, or apparatus. The term "exemplary" is used in the sense of "example," rather than "ideal."

DETAILED DESCRIPTION

Detailed illustrative aspects are disclosed herein. However, specific structural and functional details disclosed herein are merely representative for purposes of describing example embodiments of the present disclosure. The present disclosure may be embodied in many alternate forms and should not be construed as limited to only the embodiments set forth herein. Further, the terminology used herein is for the purpose of describing particular embodiments only and is not intended to be limiting of exemplary embodiments described herein.

When the specification makes reference to "one embodiment" or to "an embodiment," it is intended to mean that a particular feature, structure, characteristic, or function described in connection with the embodiment being discussed is included in at least one contemplated embodiment of the present disclosure. Thus, the appearance of the phrases, "in one embodiment" or "in an embodiment," in different places in the specification does not constitute a plurality of references to a single embodiment of the present disclosure.

As used herein, the singular forms "a," "an," and "the" are intended to include the plural forms as well, unless the context clearly indicates otherwise. It also should be noted that in some alternative implementations, the features and/or steps described may occur out of the order depicted in the figures or discussed herein. For example, two steps or figures shown in succession may instead be executed substantially concurrently or may sometimes be executed in the reverse order, depending upon the functionality/acts involved. In some aspects, one or more described features or steps may be omitted altogether, or may be performed with an intermediate step therebetween, without departing from the scope of the embodiments described herein, depending upon the functionality/acts involved.

Further, the terms "first," "second," and the like, herein do not denote any order, quantity, or importance, but rather are used to distinguish one element from another. Similarly, terms of relative orientation, such as "top," "bottom," etc. are used with reference to the orientation of the structure illustrated in the figures being described. It should also be noted that all numeric values disclosed herein may have a variation of ±10% (unless a different variation is specified) from the disclosed numeric value. Further, all relative terms such as "about," "substantially," "approximately," etc. are used to indicate a possible variation of ±10% (unless noted otherwise or another variation is specified).

In some aspect, this disclosure is directed to devices and implementations of storage and/or processing devices, including, e.g., non-volatile or "permanent" memory (e.g., Flash, MRAMs, or ReRAMs). The devices and implementations include storage and/or processing devices with integrated controllers or control circuitry, for example, for field programmable gate array (FPGA) system(s). The devices and implementations may help to reduce necessary space, reduce necessary connections, improve processing speed, or otherwise improve performance. Though the description below makes reference to MRAM devices, the inventions may be implemented in other memory devices including, but not limited to, electrically erasable programmable read-only memory (EEPROM), resistive random-access-memory (ReRAM), NOR/NAND Flash, and/or ferroelectric random-access memory (FRAM).

FIG. 1 depicts a functional block diagram of a magnetoresistive random-access memory (MRAM) device 100, for example, an STT-MRAM device. MRAM device 100 may include one or more interfaces, for example, an expanded serial peripheral interface (xSPI) interface 102, to receive inputs from and/or emit outputs to one or more xSPI supplies or Input/Outputs 104. Although interface 102 is illustrated as an xSPI interface, other interfaces may be used (e.g., parallel, serial, double data rate (DDR), etc.) such that MRAM device 100 can receive and/or emit various signals. MRAM device 100 may also include a bias system 106, for example, to receive inputs from and/or emit outputs to one or more banks and/or bias supplies 108. Bias system 106 may provide bias voltages and/or otherwise provide signals to one or more other components of MRAM device 100. Furthermore, bias system 106 may include or otherwise be coupled to one or more magnetic tunnel junction (MTJ) antifuse blocks 112.

Additionally, MRAM device 100 may include a first memory array bank 114-1 (labeled "Bank 1" in FIG. 1) and a second memory array bank 114-2 (labeled "Bank 0" in FIG. 1) connected to bias system 106. MRAM device 100 may also include a first error correction code (ECC) datapath 116-1 (labeled "ECC Datapath 1" in FIG. 1), for example, connected to memory array bank 114-1, and an ECC datapath 116-2 (labeled "ECC Datapath 0" in FIG. 1), for example, connected to memory array bank 114-2. Moreover, xSPI interface 102 may be connected to ECC datapaths 116-1 and 116-2, and also to bias system 106, for example, to MTJ antifuse blocks 112. Additionally, as discussed above, xSPI interface 102 may be connected to xSPI supply (e.g., interface supply) 104.

FIG. 2 illustrates an exemplary circuit 220, including a printed circuit board 222, an MRAM device 200 (e.g., similar to MRAM device 100), a controller 224, and a field programmable gate array (FPGA) 226. In some aspects, controller 224 may be a complex programmable logic device (CPLD). Additionally, circuit 220 may be connected to one or more external inputs/outputs 228 (labeled "External IO" in FIG. 2). In FIG. 2, MRAM device 200 may be a standalone chip on the printed circuit board 222. For example, MRAM device 200, controller 224, and FPGA 226 are separately situated on printed circuit board 222. Controller 224 is connected to External IO 228, and MRAM device 200 and FPGA 226 are separately connected to controller 224. As such, signals or information from external IO 228 must be transmitted through controller 224 to reach one or more of MRAM device 220 or FPGA 226. Similarly, signals or information from MRAM device 220 or FPGA must be transmitted through controller 224 to reach external IO 228.

FIG. 3 illustrates an exemplary circuit 320, including a printed circuit board 322, a MRAM device 300 (e.g., similar to MRAM device 100), and an FPGA 326. Additionally, as shown in FIG. 3, MRAM device 300 includes controller or control circuitry 324, such as, for example, CPLD and/or other programmable devices. Controller or control circuitry 324 may be integrated into, embedded in, or otherwise incorporated into MRAM device 300. Additionally, circuit 300 may be connected to one or more external inputs/outputs 328 (labeled "External IO" in FIG. 3). Controller or control circuitry 324 (e.g., that is incorporated into MRAM device 300) may be connected to external IO 328. In some aspects, MRAM device 300 is connected to external IO 328, and thus controller or control circuitry 324 of MRAM device 300 is also connected to external IO 328. In these aspects, MRAM device 300 and controller or control circuitry 324 may both be in direct communication with external IO 328. Moreover, FPGA 326 may be in communication with MRAM device 300 and/or controller or control circuitry 324, for example, in direct communication with MRAM device 300 and/or controller or control circuitry 324. The embodiment illustrated in FIG. 3 (e.g., where controller or control circuitry 324 is integrated into MRAM 300) allows MRAM 300 and FPGA 326 to directly communicate with each other, while also simultaneously enabling communication between MRAM 300 and external IO 328. In this way, communication bottleneck can be reduced as compared to the configuration illustrated in FIG. 2 (e.g., where MRAM device 200, controller or control circuitry 224, and FPGA 226 are separately implemented on printed circuit board 222). The communication between FPGA 326 and MRAM device 300 and/or controller or control circuitry 324 may be via one or more communication lines in printed circuit board 322.

Accordingly, circuit 320 may help to reduce the number of discrete devices on printed circuit board 322. Circuit 320 may also require a smaller printed circuit board (e.g., by area) than circuit 220, or otherwise take up less space on a printed circuit board than circuit 220. Additionally, circuit 320 may allow for external IO 328 to be in communication (e.g., direct communication) with MRAM 300 and/or controller or control circuitry 324 of MRAM device 300. For example, controller or control circuitry 324 may be a design block within MRAM device 300. Furthermore, as discussed above, circuit 320 may help to reduce communication bottleneck(s), for example, through controller 324 of FIG. 3. In some aspects, circuit 320 may help to reduce the number and/or size of communication lines (e.g., fewer input/output interfaces), the number of routing channels, etc. As such, communication (e.g., communication speeds, error rate(s), etc.) between various components of circuit 320 may be improved.

FIG. 4 illustrates another exemplary circuit 420, including a printed circuit board 422, an MRAM device 400 (e.g., similar to MRAM devices 100 300), and an FPGA 426. Additionally, as shown in FIG. 4, MRAM device 400 includes controller or control circuitry 424, such as, for example, CPLD and/or other programmable devices. Controller or control circuitry 424 may be integrated into, embedded in, or otherwise incorporated into MRAM device 400. Additionally, circuit 420 may be connected to one or more external inputs/outputs 428 (labeled "External IO" in FIG. 4). Controller or control circuitry 424 (e.g., that is incorporated into MRAM device 400) may be connected to external IO 428. In some aspects, MRAM device 400 is connected to external IO 428, and thus controller or control circuitry 424 of MRAM device 400 is also connected to external IO 428. In these aspects, MRAM device 400 and controller or control circuitry 424 may both be in direct communication with external IO 428.

Moreover, FPGA 426 may be integrated into, embedded in, or otherwise incorporated into MRAM device 400, for example, in a die, stack, package, etc. In these aspects, FPGA 426 is in communication with MRAM device 400 and/or controller or control circuitry 424, for example, in direct communication with MRAM device 400 and/or controller or control circuitry 424. Similar to the embodiment illustrated in FIG. 3, the embodiment illustrated in FIG. 4 (e.g., where controller or control circuitry 424 is integrated into MRAM 400) allows MRAM 400 and FPGA 426 to directly communicate with each other, while also simultaneously enabling communication between MRAM 400 and external IO 428. In this way, communication bottleneck can be reduced as compared to the configuration illustrated in FIG. 2 (e.g., where MRAM device 200, controller or control circuitry 224, and FPGA 226 are separately implemented on printed circuit board 222).

Circuit 420 including MRAM device 400, which includes controller or control circuitry 424 (e.g., CPLD or any other type of communication interface) and/or other programmable devices along with FPGA 426, may be used in or otherwise be a part of a system-in-a-package (SIP) or a multi-die package. In other aspects, circuit 420 including MRAM device 400, which includes controller or control circuitry 424 (e.g., CPLD) and/or other programmable devices along with FPGA 426, may be used in or otherwise be a part of a multi-chip package (MCP) using known good dies of aforementioned circuits. In any of these aspects, circuit 420 may include two or three dies. For example, MRAM 400 and controller or control circuitry 424 may be on a first die, and FPGA 426 may be on a second die. Alternatively, MRAM 400 may be on a first die, and controller or control circuitry 424 may be on a second die. FPGA 426 may be on a third die.

Accordingly, circuit 420 may help to reduce the number of discrete devices on printed circuit board 422. Circuit 420 may also require a smaller printed circuit board (e.g., by area) than circuit 220 or otherwise take up less space on a printed circuit board than circuit 220. Additionally, circuit 420 may allow for external IO 428 to be in communication (e.g., direct communication) with MRAM device 400 and/or controller or control circuitry 424 of MRAM device 400. For example, controller or control circuitry 424 may be a design block within MRAM device 400. Furthermore, as discussed above, circuit 420 may help to reduce communication bottleneck(s), for example, through controller 424 of FIG. 4. In some aspects, circuit 420 may help to reduce the number and/or size of communication lines (e.g., fewer input/output interfaces), the number of routing lines or channels, etc. As such, communication (e.g., communication speeds, error rate(s), etc.) between various components of circuit 420 may be improved.

Figure 5:
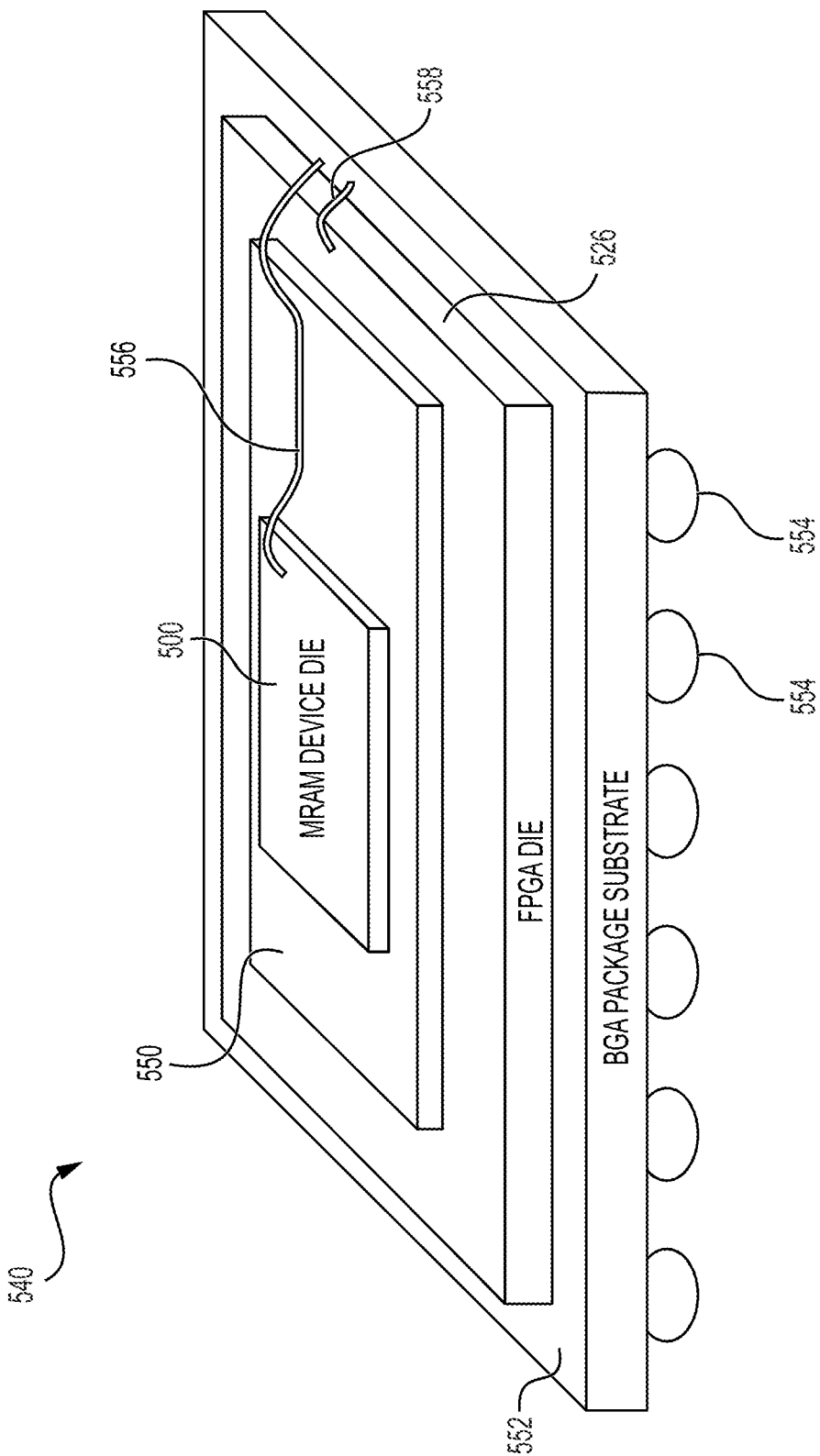
FIG. 5 depicts a perspective view of a circuit with an exemplary MRAM device in a package, according to aspects of this disclosure Again, there are many embodiments described and illustrated herein. The present disclosure is neither limited to any single aspect nor embodiment thereof, nor to any combinations and/or permutations of such aspects and/or embodiments. Each of the aspects of the present disclosure, and/or embodiments thereof, may be employed alone or in combination with one or more of the other aspects of the present disclosure and/or embodiments thereof. For the sake of brevity, many of those combinations and permutations are not discussed separately herein.

FIG. 5 provides a perspective view of an exemplary circuit 540, which includes an MRAM device 500 (e.g., similar to MRAM devices 100 300, 400) in an MCP or a SIP configuration with an FPGA 526. Additionally, as shown in FIG. 5, MRAM device 500 may be implemented as an MRAM device die, and FPGA 526 may be implemented as an FPGA die. In some aspects, MRAM 500 and FPGA 526 are separated by one or more substrates or redistribution layers 550. Moreover, MRAM device 500 or FPGA 526 may be mounted on or otherwise positioned on at least a portion of a package substrate 552, for example, a ball grid array (BGA) package substrate including a plurality of balls 554 for electrical or communication contacts. Additionally, circuit 540 may include a plurality of routing lines. For example, circuit 540 may include a first routing line 556 connecting MRAM device 550 to package substrate 552, and a second routing line 558 connecting FPGA 526 to package substrate 552. In some aspects, first routing line 556 may provide power to MRAM device 500, for example, as an MRAM bank isolated power routing line.

As mentioned, circuit 540 includes MRAM device 500 as a die or a chiplet, for example, in an MCP (multi-chip package), a SIP (system-in-a-package), or a multi-die package. Additionally, MRAM device 500 (e.g., MRAM device die) includes one or more Inputs/Outputs and a power supply connected to substrate 550, for example via first routing 556. Substrate 550 further may include a routing and plane for IOs and power supplies. MRAM banks (e.g., of MRAM device 500) also may include an isolated power supply plane from any other supply plane, for example, in substrate 550. In these aspects, the power supply for the MRAM banks in MRAM device 500 may be routed in such a way to reduce inductance and to provide supply noise isolation. In an alternate embodiment, circuit 540 may comprise of FPGA die 526 and MRAM device die 500 placed side by side directly above a substrate, for example, substrate 552.

As with circuits 320 and 420, circuit 540 may help to reduce the number of discrete devices, for example, on package substrate 552. Circuit 540 may also require a smaller printed circuit board (e.g., by area) than circuit 220 or otherwise take up less space on a printed circuit board than circuit 220. Additionally, circuit 540 may allow for an external IO (not shown) to be in communication (e.g., direct communication) with MRAM device 500 and/or the controller or control circuitry of MRAM device 500. For example, the controller or control circuitry may be a design block within MRAM device 500. Furthermore, circuit 540 may help to reduce communication bottleneck(s), for example, through a controller integrated in MRAM device 500 (e.g., controller or control circuitry 324, 424). In some aspects, circuit 540 may help to reduce the number of size of communication lines (e.g., fewer input/output interfaces), the number of routing lines or channels, etc. As such, communication (e.g., communication speeds, error rate(s), etc.) between various components of circuit 540.

In the embodiments discussed above, one or more of MRAM devices 300, 400, 500 may be a standalone chip. Alternatively, MRAM devices 300, 400, 500 may be a die in a multi-chip package (MCP). Furthermore, in other aspects, MRAM devices 300, 400, 500 may be a part of a system-in-a-package (SiP). In any of these aspects, MRAM devices 300, 400, 500 each include various circuit blocks. Additionally, MRAM devices 300, 400, 500 each include one or more interface blocks with IOs (e.g., interface 102, external IOs 328, 428, bias system 106, etc.) for external communication. The interface block(s) can be xSPI, parallel, serial, double data rate (DDR), or other types of interfaces. Moreover, the banks (e.g., memory array banks 114-1, 114-2) in MRAM devices 300, 400, 500 may be chiplet-like wide IO data fetch. For example, the banks in MRAM devices 300, 400, 500 may be 1024 or 512 bit data wide input/output in ST-DDR (spin-torque double data rate). In other aspects, the banks in MRAM devices 300, 400, 500 may be 256 or less bit data wide input/output in xSPI STT-MRAM (expanded serial peripheral interface spin-transfer-torque MRAM).

Additionally, MRAM devices 300, 400, 500, and circuits 320, 420, 540 may include or otherwise be coupled to various inputs/outputs. Although various figures illustrate an xSPI interface, this disclosure is not so limited. Alternatively, MRAM devices 300, 400, 500, and circuits 320, 420, 540 may include or otherwise be coupled to a wide IO data fetch interfaces, for example, 2000 bit wide IO interfaces, for example, sending and/or otherwise transmitting 2000 bits simultaneously.

The devices and structures disclosed herein may be used alone or in combination with one or more features disclosed in the following patents: U.S. Pat. Nos. 9,336,872; 9,754,652; 9,336,849; 9,530,476; and 9,697,879, the entireties of which are incorporated by reference herein.

There are many embodiments of the present disclosure described and illustrated herein. The present disclosure is neither limited to any single aspect nor embodiment thereof, nor to any combinations and/or permutations of such aspects and/or embodiments. Moreover, each of the aspects of the present disclosure, and/or embodiments thereof, may be employed alone or in combination with one or more of the other aspects of the present disclosure and/or embodiments thereof. For the sake of brevity, certain permutations and combinations are not discussed and/or illustrated separately herein; however, all permutations and combinations are considered to fall within the scope of the present inventions.

In one embodiment, a memory device may include a printed circuit board, a magnetoresistive random-access memory (MRAM) device coupled to the printed circuit board, a controller or control circuitry, a field programmable gate array (FPGA) coupled to the printed circuit board and in communication with the controller or control circuitry. The controller or control circuitry may be integrated into, embedded in, or otherwise incorporated into the MRAM device.

The memory device may include one or more of the following aspects. The MRAM device may include a bias system with a plurality of magnetic tunnel junction antifuse blocks. The MRAM device may include at least one memory bank and at least one error correction code datapath. The MRAM device may include at least two memory banks and at least two error correction code datapaths. The MRAM device may include an expanded serial peripheral interface. The MRAM device, the controller or control circuitry, and the FPGA may be coupled in a die. The MRAM device and the FPGA may be separated by a substrate or redistribution layer. The substrate or the redistribution layer may include an MRAM bank isolated power routing line. The MRAM device and the FPGA may be mounted on a package substrate. The package substrate may be a ball grid array package substrate. The MRAM device and the FPGA may be connected to the package substrate via respective routings. The die may be a multi-chip package or a system-in-a-package. The controller or control circuitry may include a complex programmable logic device. The MRAM device may be a 1024 or 512 bit data wide input/output in ST-DDR. The MRAM device may be a 256 or less bit data wide input/output in xSPI STT-MRAM.

In another embodiment, a memory device includes a printed circuit board, a magnetoresistive random-access memory (MRAM) device coupled to the printed circuit board, a controller or control circuitry, and a field programmable gate array (FPGA) coupled to the printed circuit board and in communication with the controller or control circuitry. The controller or control circuitry may be integrated into, embedded in, or otherwise incorporated into the MRAM device. The MRAM device, the controller or control circuitry, and the FPGA may be coupled in a die.

The memory device may include one or more of the following aspects. The controller or control circuitry may include a complex programmable logic device. The MRAM device may include a bias system with a plurality of magnetic tunnel junction antifuse blocks, at least two memory banks and at least two error correction code datapaths, and an expanded serial peripheral interface.

In yet another aspect, a memory device includes a package substrate, a magnetoresistive random-access memory (MRAM) device, a controller or control circuitry, and a field programmable gate array (FPGA) in communication with the controller or control circuitry. The controller or control circuitry may be integrated into, embedded in, or otherwise incorporated into the MRAM device. The MRAM device, the controller circuitry, and the FPGA may be coupled in a die on the package substrate. The MRAM device and the FPGA may be connected to the package substrate by respective routings.

The memory device may include one or more of the following aspects. The package substrate may be a ball grid array package substrate. The MRAM device and the FPGA may be separated by a redistribution layer. The redistribution layer may include an MRAM bank isolated power routing line. The controller or control circuitry may include a complex programmable logic device.

The foregoing description of the inventions has been described for purposes of clarity and understanding. It is not intended to limit the inventions to the precise form disclosed. Various modifications may be possible within the scope and equivalence of the application.

We claim:

1. A memory device, comprising:
   a printed circuit board;
   a magnetoresistive random-access memory (MRAM) device coupled to the printed circuit board;
   a controller or control circuitry, wherein the controller or control circuitry is integrated into, embedded in, or otherwise incorporated into the MRAM device; and
   a field programmable gate array (FPGA) coupled to the printed circuit board and in communication with the controller or control circuitry,
   wherein the MRAM device includes at least one memory bank and at least one error correction code datapath.

2. The memory device of claim 1, wherein the MRAM device includes a bias system with a plurality of magnetic tunnel junction antifuse blocks.

3. The memory device of claim 1, wherein the MRAM device includes at least two memory banks and at least two error correction code datapaths.

4. The memory device of claim 1, wherein the MRAM device includes an expanded serial peripheral interface.

5. The memory device of claim 1, wherein the MRAM device, the controller or control circuitry, and the FPGA are coupled in a die.

6. The memory device of claim 5, wherein the MRAM device and the FPGA are separated by a substrate or redistribution layer, and wherein the substrate or the redistribution layer includes an MRAM bank isolated power routing line.

7. The memory device of claim 6, wherein the MRAM device and the FPGA are mounted on a package substrate.

8. The memory device of claim 7, wherein the package substrate is a ball grid array package substrate.

9. The memory device of claim 7, wherein the MRAM device and the FPGA are connected to the package substrate via respective routings.

10. The memory device of claim 5, wherein the die is a multi-chip package or a system-in-a-package.

11. The memory device of claim 1, wherein the controller or control circuitry includes a complex programmable logic device.

12. The memory device of claim 1, wherein the MRAM device is a 1024 or 512 bit data wide input/output in ST-DDR.

13. The memory device of claim 1, wherein the MRAM device is a 256 or less bit data wide input/output in xSPI STT-MRAM.

14. A memory device, comprising:
a printed circuit board;
a magnetoresistive random-access memory (MRAM) device coupled to the printed circuit board;
a controller or control circuitry, wherein the controller or control circuitry is integrated into, embedded in, or otherwise incorporated into the MRAM device; and
a field programmable gate array (FPGA) coupled to the printed circuit board and in communication with the controller or control circuitry,
wherein the MRAM device, the controller or control circuitry, and the FPGA are coupled in a die, and
wherein the MRAM device includes at least one memory bank and at least one error correction code datapath.

15. The memory device of claim 14, wherein the controller or control circuitry includes a complex programmable logic device.

16. The memory device of claim 14, wherein the MRAM device includes:
a bias system with a plurality of magnetic tunnel junction antifuse blocks;
at least two memory banks and at least two error correction code datapaths; and
an expanded serial peripheral interface.

17. A memory device, comprising:
a package substrate;
a magnetoresistive random-access memory (MRAM) device;
a controller or control circuitry, wherein the controller or control circuitry is integrated into, embedded in, or otherwise incorporated into the MRAM device; and
a field programmable gate array (FPGA) in communication with the controller or control circuitry,
wherein the MRAM device, the controller circuitry, and the FPGA are coupled in a die on the package substrate, and
wherein the MRAM device and the FPGA are connected to the package substrate by respective routings, and
wherein the MRAM device includes at least one memory bank and at least one error correction code datapath.

18. The memory device of claim 17, wherein the package substrate is a ball grid array package substrate, wherein the MRAM device and the FPGA are separated by a redistribution layer, and wherein the redistribution layer includes an MRAM bank isolated power routing line.

19. The memory device of claim 17, wherein the controller or control circuitry includes a complex programmable logic device.

20. The memory device of claim 17, wherein the MRAM device includes a bias system with a plurality of magnetic tunnel junction antifuse blocks.

* * * * *